United States Patent
Yuan et al.

(10) Patent No.: US 8,456,911 B2
(45) Date of Patent: Jun. 4, 2013

(54) INTELLIGENT SHIFTING OF READ PASS VOLTAGES FOR NON-VOLATILE STORAGE

(75) Inventors: Jiahui Yuan, Milpitas, CA (US); Yingda Dong, San Jose, CA (US); Charles Kwong, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 224 days.

(21) Appl. No.: 13/155,323

(22) Filed: Jun. 7, 2011

(65) Prior Publication Data

US 2012/0314499 A1  Dec. 13, 2012

(51) Int. Cl.
*G11C 11/34* (2006.01)

(52) U.S. Cl.
USPC ............ 365/185.11; 365/185.14; 365/185.18; 365/185.29

(58) Field of Classification Search
USPC .............. 365/185.11, 185.14, 185.18, 185.29
See application file for complete search history.

(56) References Cited

U.S. PATENT DOCUMENTS

| | | |
|---|---|---|
| 6,771,536 B2 | 8/2004 | Li |
| 6,996,003 B2 | 2/2006 | Li |
| 7,012,835 B2 | 3/2006 | Gonzalez |
| 7,057,936 B2 * | 6/2006 | Yaegashi et al. ......... 365/185.22 |
| 7,145,804 B2 | 12/2006 | Guterman |
| 7,177,977 B2 | 2/2007 | Chen |
| 7,218,552 B1 | 5/2007 | Wan |
| 7,230,854 B2 | 6/2007 | Wan |
| 7,262,994 B2 | 8/2007 | Fong |
| 7,295,473 B2 | 11/2007 | Fong |
| 7,298,647 B2 | 11/2007 | Li |
| 7,339,834 B2 | 3/2008 | Lutze |
| 7,349,258 B2 | 3/2008 | Fong |
| 7,376,011 B2 | 5/2008 | Conley |
| 7,385,854 B2 | 6/2008 | Chen |
| 7,440,318 B2 | 10/2008 | Fong |
| 7,447,065 B2 | 11/2008 | Fong |
| 7,451,264 B2 | 11/2008 | Yero |
| 7,468,911 B2 | 12/2008 | Lutze |
| 7,468,920 B2 | 12/2008 | Sekar |
| 7,495,956 B2 | 2/2009 | Fong |
| 7,554,848 B2 | 6/2009 | Li |
| 7,586,157 B2 | 9/2009 | Mokhlesi |
| 7,616,490 B2 | 11/2009 | Mokhlesi |
| 7,619,930 B2 | 11/2009 | Mokhlesi |
| 7,630,254 B2 | 12/2009 | Lutze |
| 7,633,812 B2 | 12/2009 | Lutze |
| 7,751,244 B2 | 7/2010 | Sekar |
| 7,808,819 B2 * | 10/2010 | Murin et al. ............. 365/185.03 |
| 7,808,831 B2 | 10/2010 | Mokhlesi |

(Continued)

OTHER PUBLICATIONS

PCT International Search Report dated Aug. 14, 2012, PCT Patent Application No. PCT/US2012/040311.

(Continued)

*Primary Examiner* — Son Dinh
(74) *Attorney, Agent, or Firm* — Vierra Magen Marcus LLP

(57) ABSTRACT

A first read pass voltage is determined and optimized for cycled memory. One or more starting read pass voltages are determined for one or more dies. The system dynamically calculates a current read pass voltage based on the number of program/erase erase cycles, the first read pass voltage and the respective starting read pass voltage. Data is read from one or more non-volatile storage elements using the calculated current read pass voltage.

33 Claims, 14 Drawing Sheets

U.S. PATENT DOCUMENTS

| | | |
|---|---|---|
| 7,817,469 B2 | 10/2010 | Avraham |
| 7,839,690 B2 | 11/2010 | Lee |
| 7,898,864 B2 | 3/2011 | Dong |
| 2007/0195603 A1 | 8/2007 | Aritome |
| 2010/0329010 A1 | 12/2010 | Dong |

OTHER PUBLICATIONS

PCT Written Opinion of the International Searching Authority dated Aug. 14, 2012, PCT Patent Application No. PCT/US2012/040311.

* cited by examiner

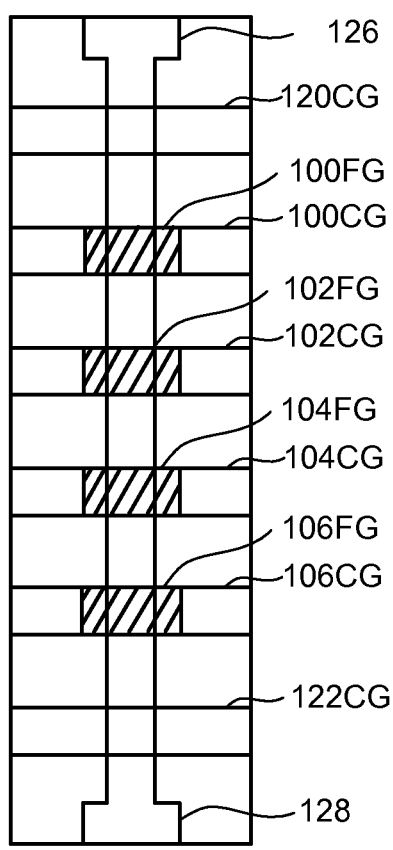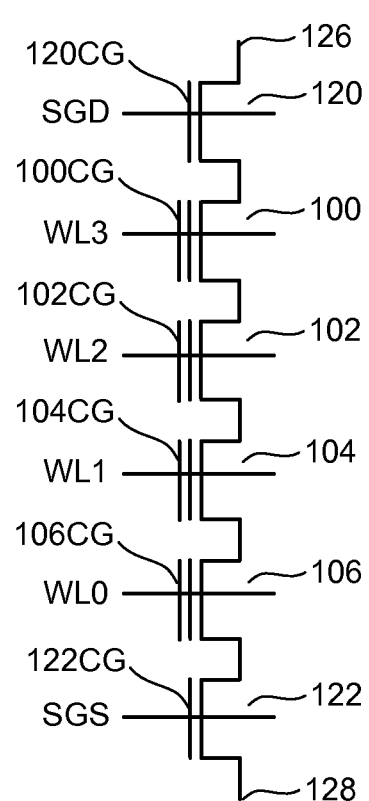
Fig. 1
Fig. 2

INTELLIGENT SHIFTING OF READ PASS VOLTAGES FOR NON-VOLATILE STORAGE

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2 v, 0.3 v, 0.4 v, or others). Between pulses, the memory system will verify whether the individual memory cells have reached their respective target threshold voltage ranges. Those memory cells that have reached their target threshold voltage range will be locked out of future programming (e.g., by raising the bit line voltage to Vdd). When all memory cells have reached their target threshold voltage range, programming is complete.

In some cases, the performance and behavior of non-volatile storage devices can change as the non-volatile storage devices undergo many program and erase cycles. To account for this change, various operating parameters can be optimized for non-volatile storage devices that have been programmed and erased many times. However, optimizing operating parameters for non-volatile storage devices that have been programmed and erased many times can result in a compromise in performance for non-volatile storage devices that have not been programmed and erased many times.

BRIEF DESCRIPTION OF THE DRAWINGS

FIG. 1 is a top view of a NAND string.

FIG. 2 is an equivalent circuit diagram of the NAND string.

DETAILED DESCRIPTION

Figure 3:
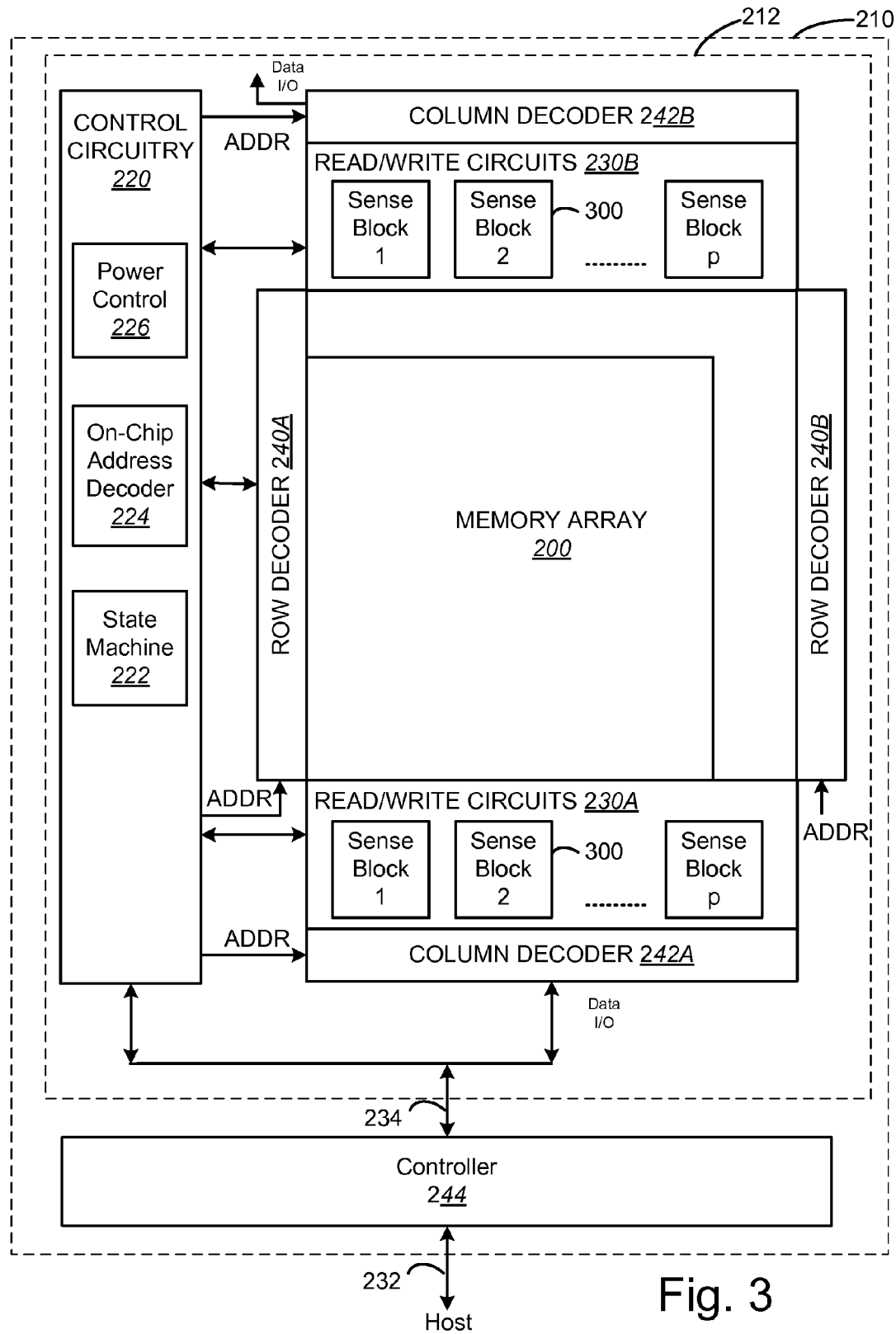
FIG. 3 is a block diagram of a non-volatile memory system.

During read and verify operations for some non-volatile memory, the unselected word lines (e.g., the word lines that are not connected to memory cells that are selected to be read) are raised to a read pass voltage (e.g., 5-10 volts) to make the memory cells operate as pass gates. The selected word line is connected to a voltage, a level of which is specified for each read and verify operation, in order to determine whether a threshold voltage of the concerned memory cell has reached such level. Because the unselected word lines receive the read pass voltage, memory cells along unselected word lines that have a lower threshold voltage during a read operation will receive a voltage on their control gate which over time may cause electrons to be injected into their floating gate. Injecting electrons into the floating gate will raise the threshold voltage of those memory cells. Memory cells that have been programmed to a state corresponding to a higher threshold voltage receiving the read pass voltage may, over time, experience electrons moving from the floating gate to the control gate, which lowers the threshold voltage. Experience has shown that if the memory cells experience many read operations, without a program or erase operation, the threshold voltage may change over time as describe above. This behavior is called Read Disturb.

It has been observed that fresh memories are more susceptible to read disturb than cycled memory. Fresh memory or memory in a fresh condition refers to memory that has not experienced many program/erase cycles. Cycled memory or memory in a cycled condition refers to memory that has experienced many program/erase cycles. In one example, memory is in a cycled condition when it has experienced 100 program/erase cycles. A program/erase cycle is the combination of erasing the memory cells and programming the memory cells. One theory is that cycled memory has electrons caught in the insulation between the control gate and the floating gate that reduce the electric field caused by the read pass voltage. Because the electric field is reduced, the unwanted movement of electrons is reduced for cycled memory. This behavior suggests that a lower read pass voltage will reduce the read disturb.

As non-volatile storage experiences many program/erase cycles, some memory cells may experience program noise and/or data retention issues. As explained above, multi-state non-volatile memory is implemented by identifying multiple, distinct allowed threshold voltage ranges. Each distinct threshold voltage range corresponds to a predetermined value for the set of data bits. Over time, the distinct allowed threshold voltage ranges may become wider and less distinct, which is known as program noise.

Additionally, after many program and erase cycles, some non-volatile memory will experience electrons moving off of the floating gate without the memory cell being erased, programmed or read. This will cause the threshold voltage of the memory cells to drift, which may result in data retention problems.

A high read pass voltage can be used to overcome program noise and data retention problems. By using a higher read pass voltage, the system can more easily distinguish between multiple, distinct allowed threshold voltage ranges even if there is program noise and/or data retention issues. However, using a higher read pass voltage to address program noise and data retention for cycled memory may exacerbate read disturb for fresh memory. Therefore, it is proposed to implement a non-volatile storage system that changes the read pass voltage over time. Fresh memory will use a lower read pass voltage, while cycled memory will use a higher read pass voltages.

In one embodiment, the system will determine a read pass voltage optimized for cycled memory and a read pass voltage optimized for fresh memory based on simulation, testing and/or experimentation. The read pass voltages can be determined for an entire wafer, individual dies, individual blocks or other units. In some implementations, the read pass voltage optimized for fresh memory is determined such that a number of failed bits for a fresh die using the read pass voltage optimized for fresh memory is within a predetermined percentage of a number of failed bits caused by using the read pass voltage optimized for cycled memory with the die in the fresh condition. In some embodiments, the read pass voltage optimized for cycled memory is determined for an entire wafer (or another set of multiple dies) and the read pass voltage optimized for fresh memory is determined for individual dies (or individual blocks or other units).

The non-volatile storage system will be configured to monitor the number of program/erase cycles experienced by the memory. The number of program/erase cycles can be monitored for the entire system, individual dies, individual blocks or other units. When a read process needs to be performed, the system (e.g., controller, state machine or other component) will access the count of program/erase cycles and dynamically determine a current read pass voltage to use for the read process based on the count of program/erase cycles, the read pass voltage optimized for cycled memory and the read pass voltage optimized for fresh memory.

This dynamically determined current read pass voltage will be applied to the unselected word lines. In one embodiment, the current read pass voltage will be applied to multiple unselected word lines on one and/or both sides of the selected word line while applying a read compare voltage to the selected word line so that the data from the selected memory cells is read. In some embodiments, the word lines next to the selected word line may receive a different pass voltage.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells.

Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. U.S. 2003/0002348.

Other types of non-volatile storage devices, in addition to NAND flash memory, can also be used to implement the new technology described herein. For example, a TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
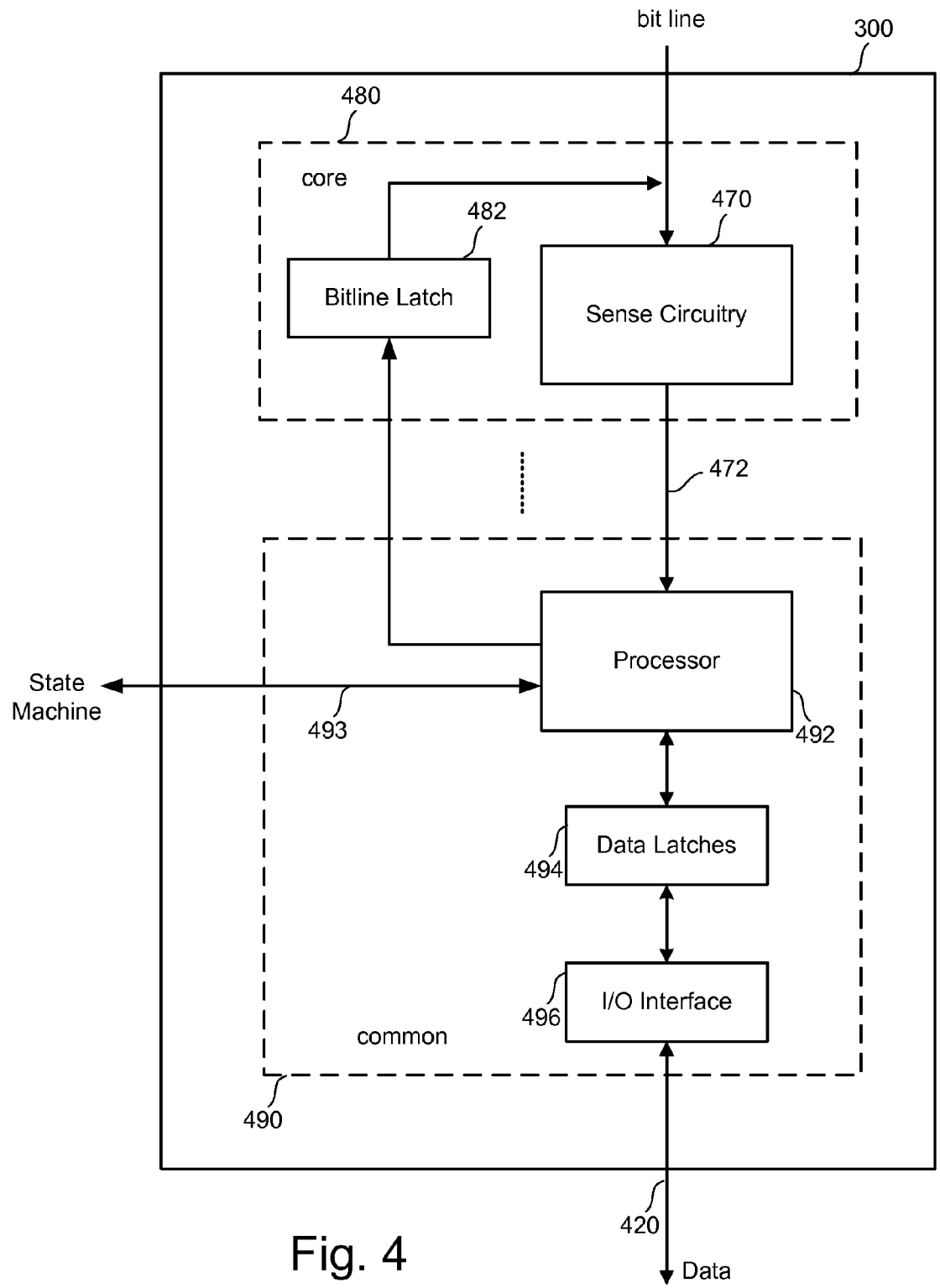
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
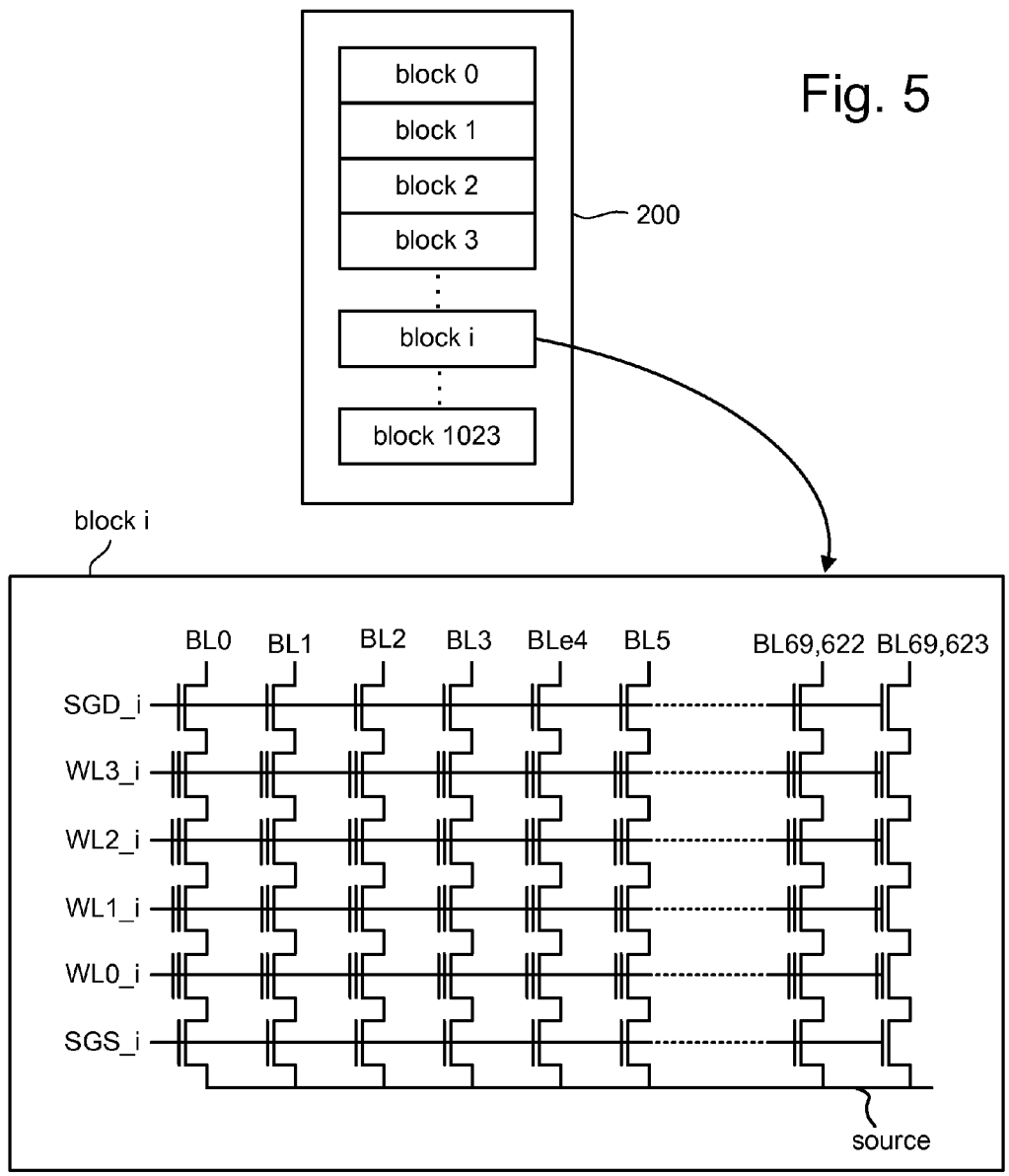
FIG. 5 is a block diagram depicting one embodiment of a memory array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Figure 6:
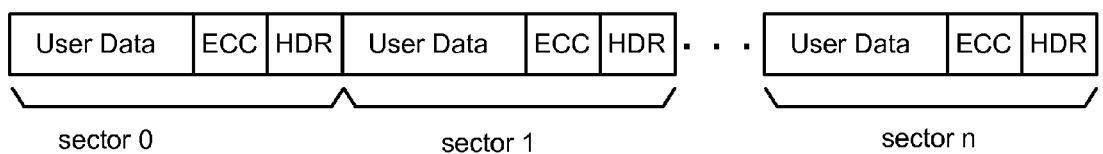
FIG. 6 depicts a page of data.

FIG. 6 depicts data for a page. Depending on the size of the page, the page contains many sectors. Each sector includes User Data, error correction codes (ECC), and header information (HDR).

In some memory systems utilizing multi-state memory cells, each bit of data in a memory cell is in a different page. For example, if an array of memory cells store three bits of data (eight states or levels of data) per memory cell, each memory cell stores data in three pages with each of the three bits being on a different page. Thus, within a block in this example, each word line is associated with three pages or an integer multiple of three pages. Other arrangements are also possible.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words to include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½).

Some memory cells are slower to program or erase than others because of manufacturing variations among those cells, because those cells were previously erased to a lower threshold voltage than others, because of uneven wear among the cells within a page, or other reasons. And, of course, some cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

Error correction is typically performed on a sector-by-sector basis. Thus, each sector will have its own set of ECC codes. This error correction is convenient and useful because, in one embodiment, the sector is the desired unit of data transfer to and from the host system.

Figure 7:
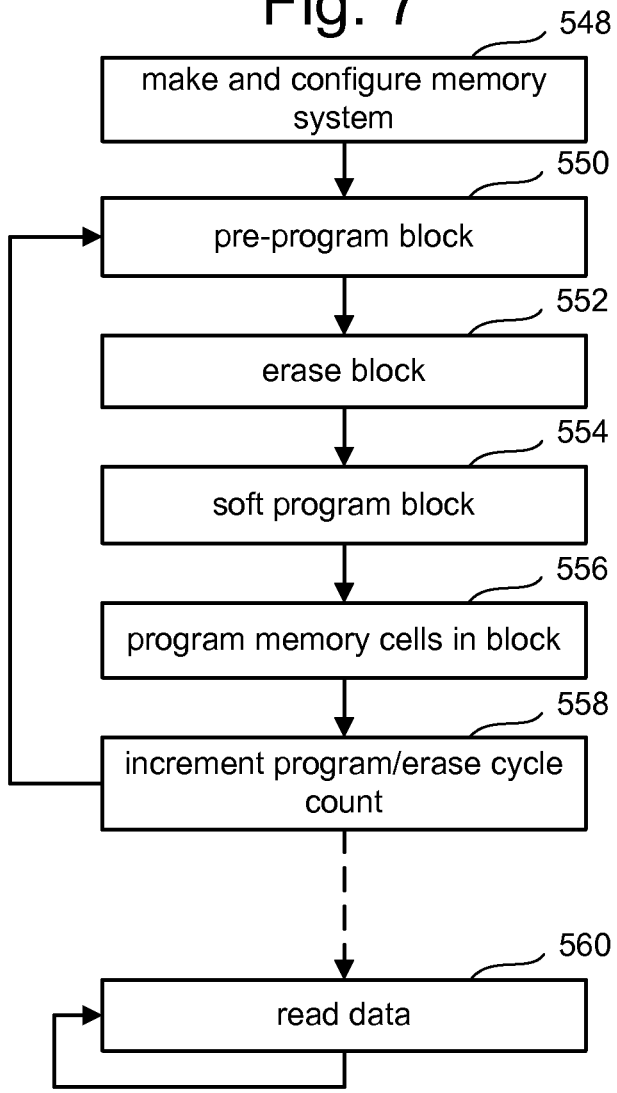
FIG. 7 is a flow chart describing one embodiment of a process for making and using a non-volatile storage system.

FIG. 7 is a flow chart describing a process for making and operating a non-volatile storage system. In step 548, the non-volatile storage system is manufactured and configured for use. More details of step 548 are provided below. Once the non-volatile storage system is manufactured and configured, it may be used to program and read data. Step 550 is optionally performed as part of a process to program data. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution.

In step 556, the memory cells of the block are programmed. The programming can be performed in response to a request to program from the host, or in response to an internal process. In step 558, the program/erase cycle count is incremented. The non-volatile storage system will maintain a count of program/erase cycles in a register, flash memory or other location. After each program/erase cycle the program/erase cycle count is incremented.

After programming, the memory cells of the block can be read (step 560). Many different read processes known in the art can be used to read data. In some embodiments, the read process includes using ECC to correct errors. The data that is read is output to the hosts that requested the read operation. The ECC process can be performed by the state machine, the controller or another device.

FIG. 7 shows that the erase-program cycle can happen many times without or independent of reading (loop consisting of steps 550-558), the read process can occur many times without or independent of programming, and the read process can happen any time after programming (represented by the dashed line between 558 and 560). The process of FIG. 7 can be performed at the direction of the state machine using the various circuits described above. In other embodiments, the process of FIG. 7 can be performed at the direction of the Controller using the various circuits described above.

Figure 8:
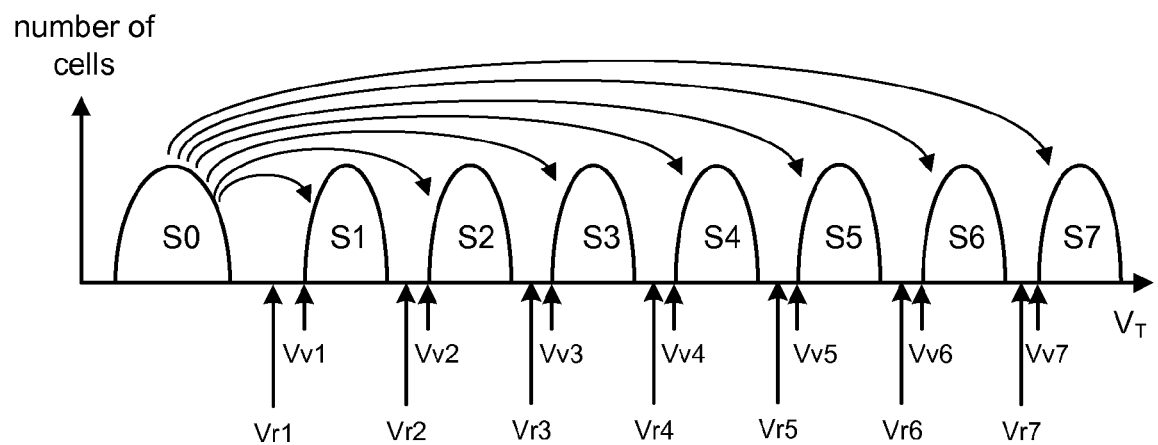
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) U.S. Patent Application Pub No. 2004/0109357; (3) U.S. Patent Application Pub. No. 2005/0169082; and (4) U.S. Patent Application Pub.

No. 2006/0221692. The read and verify operations described above are performed according to techniques known in the art. Thus, many of the details explained can be varied by one skilled in the art. Other read and verify techniques known in the art can also be used.

Figure 9:
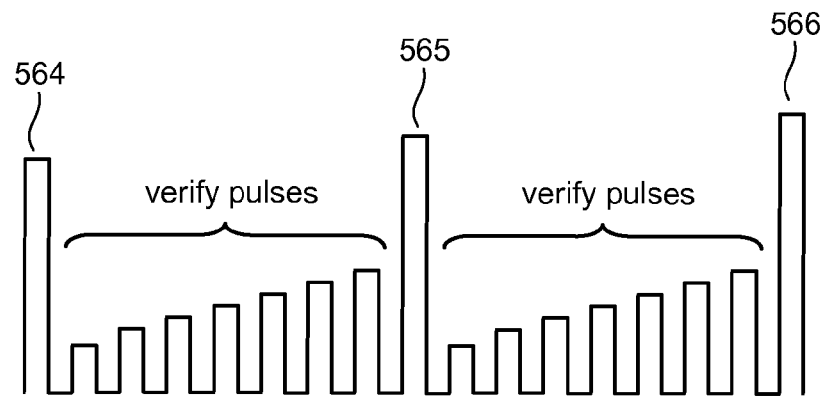
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224, 614; U.S. Pat. No. 7,310,255; U.S. Pat. No. 7,301,817; U.S. Patent App. 2004/0109362; and U.S. Patent App. 2009/0147573.

Figure 10A:
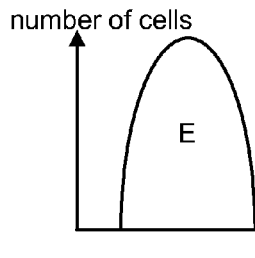
FIGS. 10A-E show various threshold voltage distributions and describe a process for programming non-volatile memory.
Figure 10B:
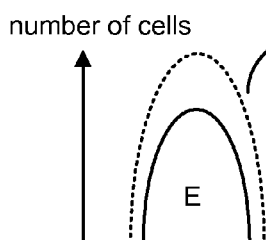

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
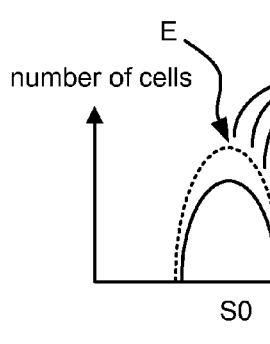
Figure 10D:
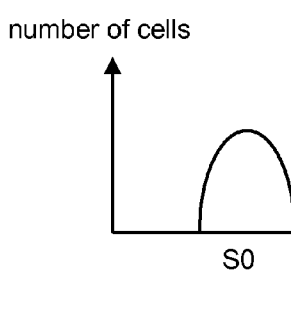
Figure 10E:
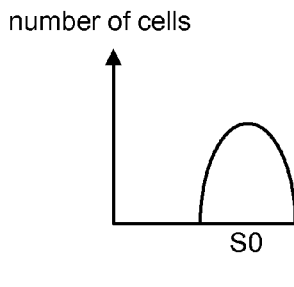

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

In some programming processes, coarse/fine programming techniques can be incorporated. For example, memory cells being programmed to a target condition (e.g., Vv2) would first be quickly programmed to coarse condition (e.g., Vv2 less a small voltage) that corresponds to a threshold voltage condition slightly lower than the target condition. Subsequently, the memory cells would be programmed to the target condition in a manner more slowly (and with more precision). The coarse/fine programming techniques can be used for programming to all or a subset of the data states.

Figure 11:
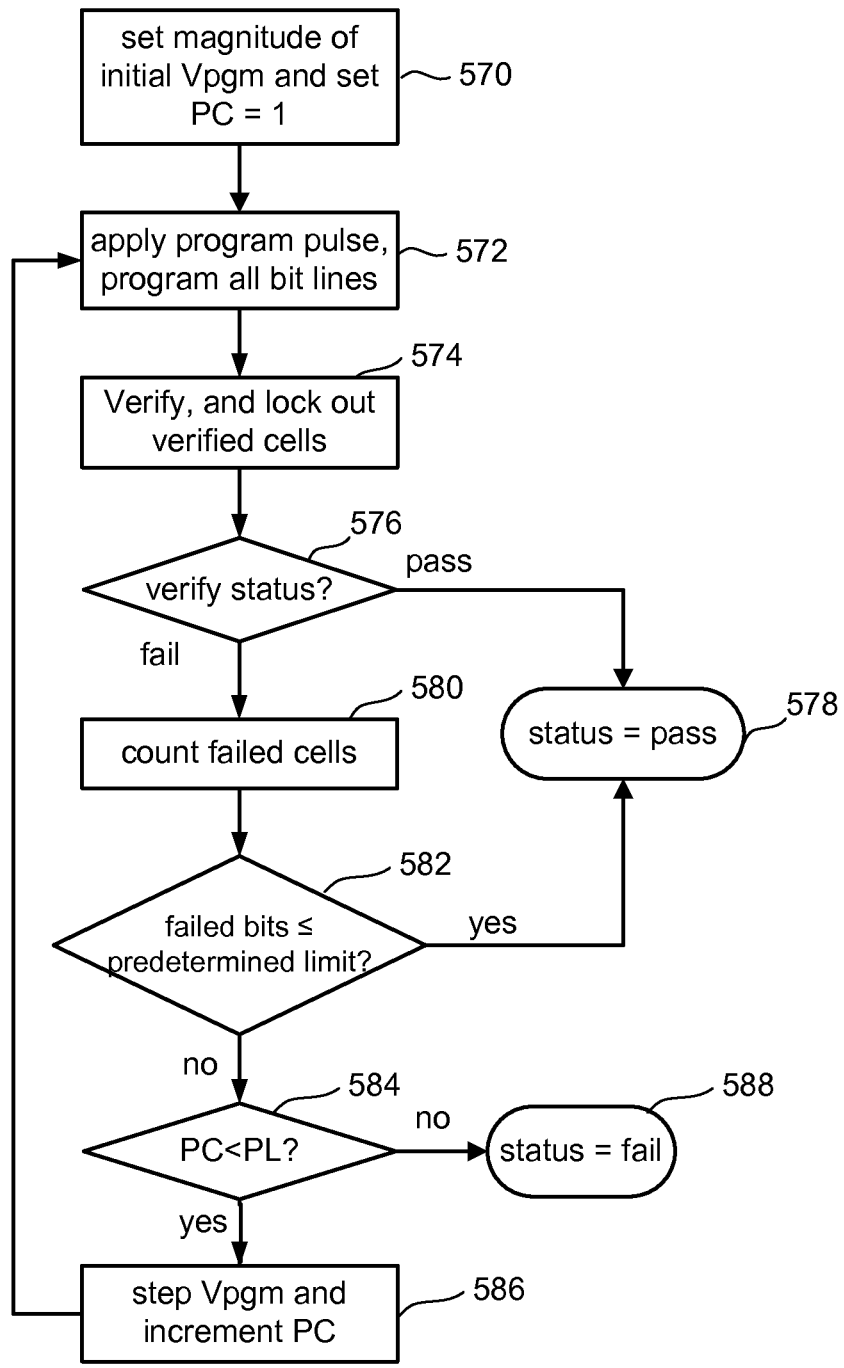
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG.

11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the appropriate verify compare voltage (Vv1, Vv2, Vv3, Vv4, Vv5, Vv6, and Vv7) to the selected word line and the current read pass voltage to unselected word lines. More details about determining the current read pass voltage are provided below.

In step 576, it is determined whether all the memory cells have reached their target threshold voltages. If so, the programming process is complete and successful because all selected memory cells were programmed and verified to their target states. A status of "PASS" is reported in step 578. If, in 576, it is determined that not all of the memory cells have reached their target threshold voltages, then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in U.S. Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed cells is not less than the predetermined limit, than the programming process continues at step 584 and the program counter PC is checked against the program limit value (PL). One example of a program limit value is 20; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 12:
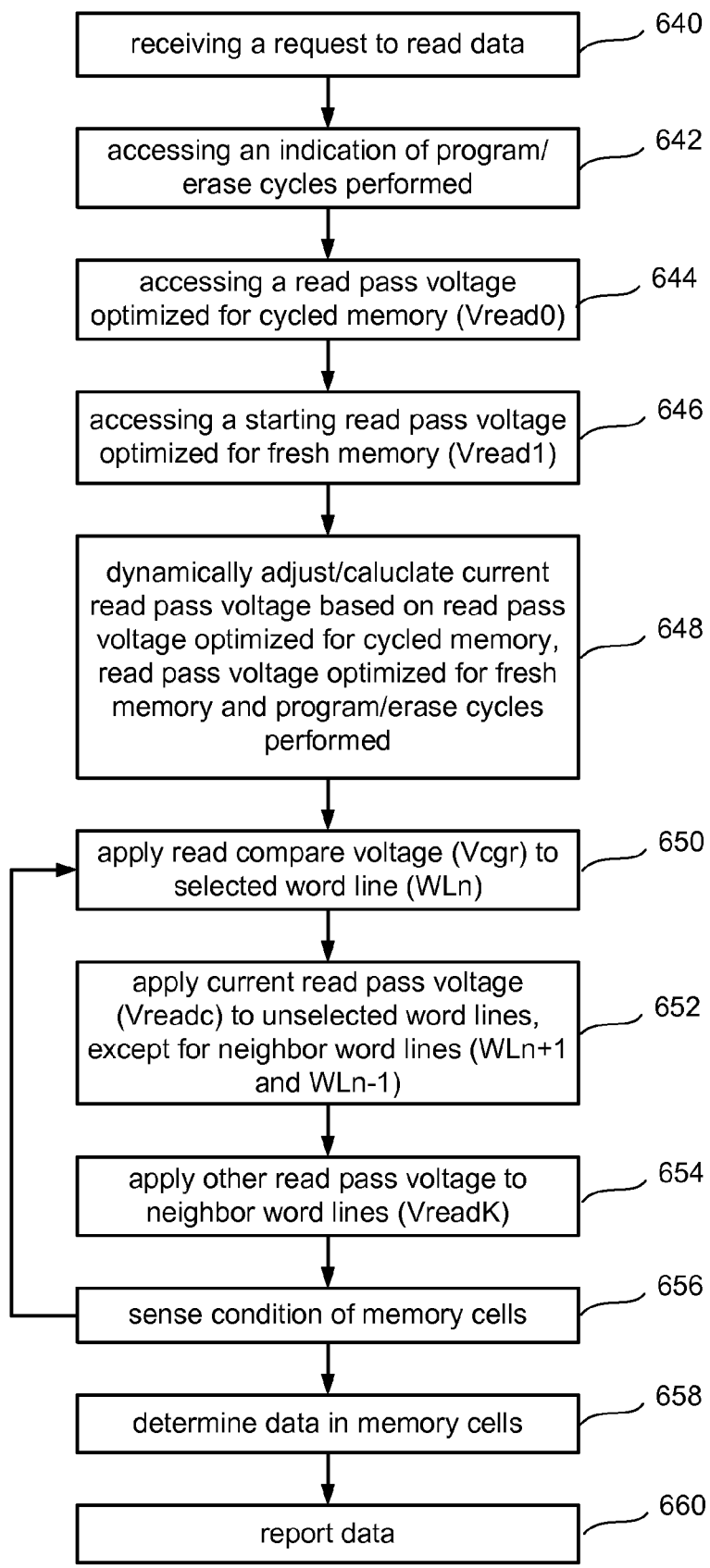
FIG. 12 is a flow chart describing one embodiment of a process for reading from non-volatile memory.

FIG. 12 is a flowchart describing one embodiment of a process for reading from non-volatile memory. The process depicted in FIG. 12 is one example implementation of step 560 of FIG. 7. The process of FIG. 12 (other than step 640) can also be used to perform a verification during programming. In step 640 of FIG. 12, a request to read data is received. This request can be received from the host or other entity. In some embodiments, a read process can be performed without a request from the host. In step 642, Controller 244 will access an indication of the number of program/erase cycles performed. As indicated above, this indication of program/erase cycles can be stored in a register, flash memory, or other storage location. In one embodiment, a memory system that has undergone zero program/erase cycles is completely fresh and a memory system that has undergone 100 program/erase cycles is considered to be in the cycled condition. Other values can also be used.

In step 644, Controller 244 will access a read pass voltage optimized for cycled memory (referred to below as Vread0). In step 646, Controller 244 will access a starting read pass voltage which is optimized for fresh memory (referred to below as Vread1). In step 648, Controller 244 will dynamically calculate the current read pass voltage (Vreadc) to use for the current read (or verify) operation based on the read pass voltage optimized for cycled memory (Vread0), the read pass voltage optimized for fresh memory (Vread1) and the indication of program/erase cycles performed. There are many different functions can be used to determine the current read pass voltage (Vreadc). More details of some embodiments are discussed below.

In step 650, the system will apply the read compare voltage (Vcgr) to the selected word line (WLn). Looking back at FIG. 8, examples of Vcgr include Vr1, Vr2, Vr3, Vr4, Vr5, Vr6, and Vr7. If a verification process is being performed, then the compare voltage would be Vv1, Vv2, Vv3, Vv4, Vv5, Vv6, or Vv7. In step 652, the system will apply the current read pass voltage (Vreadc), determined in step 648, to the unselected word lines, except for the neighbor word lines (WLn+1 and WLn−1). In step 654, another read pass voltage (VreadK) is applied to the neighbor word lines (WLn+1 and WLn−1). In step 656, the system will sense a condition of the one or more selected memory cells connected to the selected word line WLn, as discussed above.

Steps 650-656 can be performed multiple times for multiple read compare values to determine which of the multiple states the one or more memory cells hold data in. In step 658, based on the various sensing (iterations of steps 650-656), the system will determine the data values being stored in each of the selected memory cells. In step 660, the data is reported (e.g. reported to the host). Note that in the above discussion it is assumed that it is the controller that accesses the read pass voltage optimized for cycled memory (Vread0), read pass voltage optimized for fresh memory (Vread1) and the indication of the program/erase cycles performed in order to dynamically and automatically calculate (or adjust) the current read pass voltage (Vreadc). In some embodiments, other components could also calculate the current read pass voltage (e.g. state machine or other component).

Figure 13:
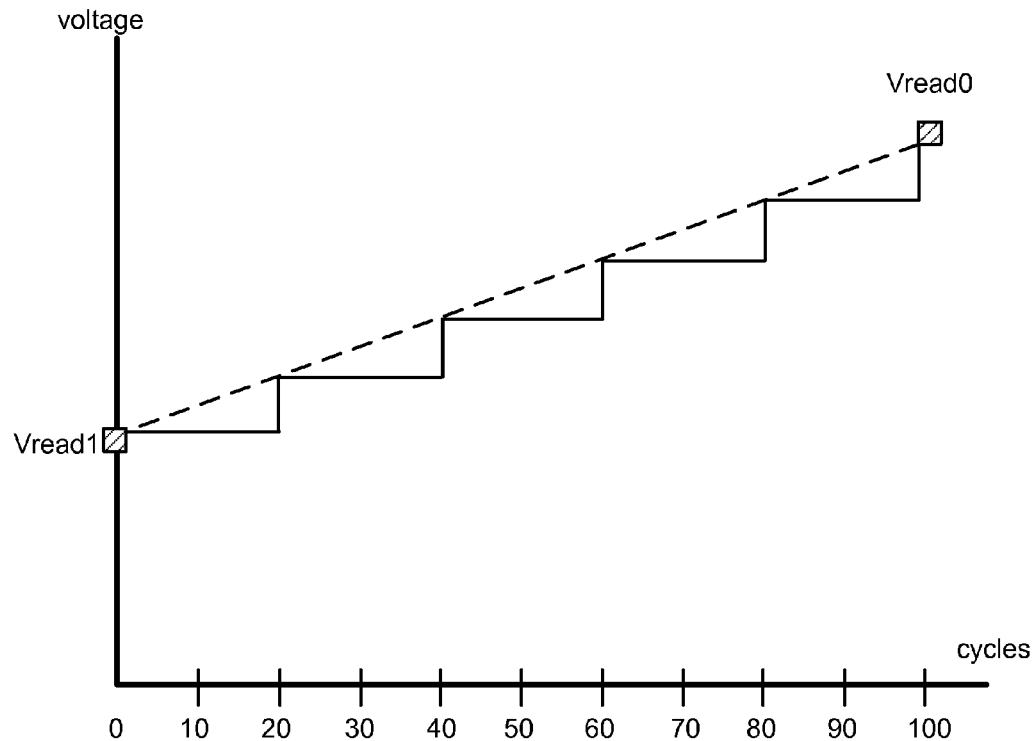
FIG. 13 is a graph that describes various embodiments for determining a read pass voltage.

The read pass voltage optimized for cycled memory (Vread0) is a higher read pass voltage than the read pass voltage optimized for fresh memory (Vread1) in order to compensate for program noise and data retention issues. The read pass voltage optimized for fresh memory (Vread1) is a lower pass voltage that is optimized to reduce the effects of read disturb. FIG. 13 is a graph that depicts the relationship of Vread1 to Vread0. The vertical axis is voltage and the horizontal axis is cycles. In one embodiment, it is assumed that the optimal read pass voltage to be used the first time the system is being operated (zero cycles) is Vread1. After 100 cycles, the system is optimized by using Vread0 as the current read pass voltage. Step 648 of FIG. 12 includes dynamically and automatically calculating the current read pass voltage based on Vread0, Vread1 and the indication of the number of program/erase cycles performed. There are many different functions that can be utilized to calculate the current read pass voltage. In one embodiment, a line is modeled from Vread1 to Vread0 using known mathematics (e.g. y=mx+b). By knowing what cycle the memory is on, the appropriate voltage can be calculated along that line. Such a line is depicted in FIG. 13 as a dashed line directly connecting Vread1 to Vread0.

Another embodiment for calculating the current read pass voltage is to use a step function such that at every 20 cycles the current read pass voltage is stepped up one-fifth the distance between Vread1 and Vread0. Therefore, if Vread0 is two volts higher than Vread1, then after 20 cycle, the current read pass voltage is increased by 0.4 volts, after 40 cycles the current read pass voltage is increased by another 0.4 volts, and so on until 100 cycles when the current read pass voltage is set equal to Vread0. FIG. 13 graphically depicts this step function with the solid line.

Another embodiment for calculating the current read pass voltage is for the controller to interpolate between Vread0 and Vread1 based on the number of cycles between 0 and 100. After 100 cycles, the controller will always use Vread0 for the current read pass voltage. Other functions to determine the current read pass voltage can also be used.

Figure 14:
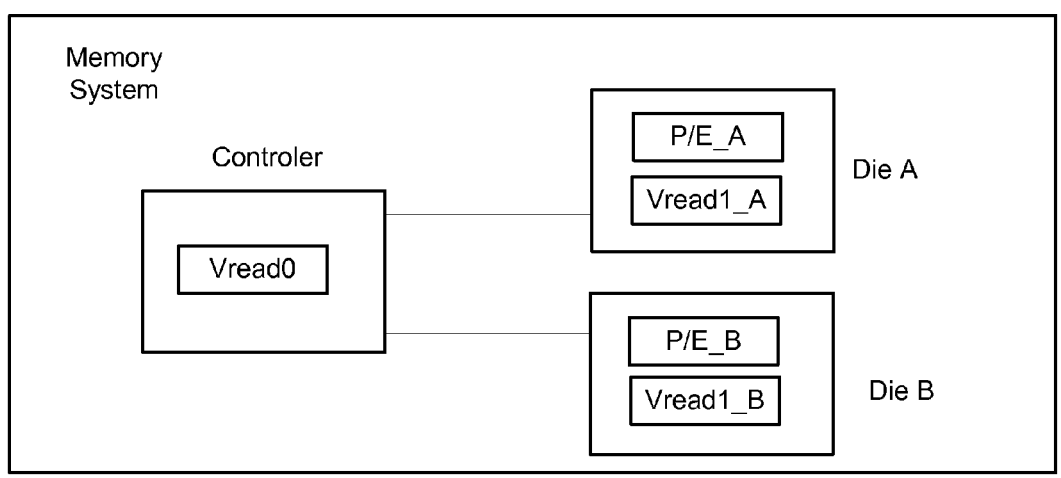
FIG. 14 is a block diagram of a memory system with more than one die.

In some embodiments, a memory system will include one memory die and one controller. In other embodiments, a memory system can include multiple memory dies connected to a common controller. FIG. 14 is a block diagram showing one example of a memory system with a single Controller connected to multiple memory die (Die A and Die B). In such an embodiment, the system can keep track of the number of programs/erase cycles separately for each die and store those numbers on the appropriate die in flash memory. Alternatively, the program/erase cycle count can be stored on the Controller.

FIG. 14 shows each of the dies storing their own count of program/erase cycles (P/E_A for Die A and P/E_B for Die B). Each die stores it own starting read pass voltage optimized for fresh memory (Vread1). That is, Die A will store Vread1_A and Die B will store its own Vread1_B. Alternatively, those starting read pass voltages (Vread1_A and Vread1_B) can be stored on the Controller or elsewhere in the system. Depending on the implementation and manufacturing process, Vread1_A and Vread1_B can be the same voltages or different. When having multiple die in a memory system, step 642 of FIG. 12 will include accessing the appropriate indication of program/erase cycles performed for the appropriate die and step 646 will include accessing the appropriate starting read pass voltage optimized for fresh memory (Vread1) for the appropriate die. In a system where a read processor is going to require reading data from multiple die, then step 12 will include performing steps 642-658 separately for each die. In one embodiment, the multiple dies will share the same read pass voltage optimized for cycled memory (Vread0). In other embodiments, the multiple dies will have different read pass voltages optimized for cycled memory (Vread0).

Figure 15:
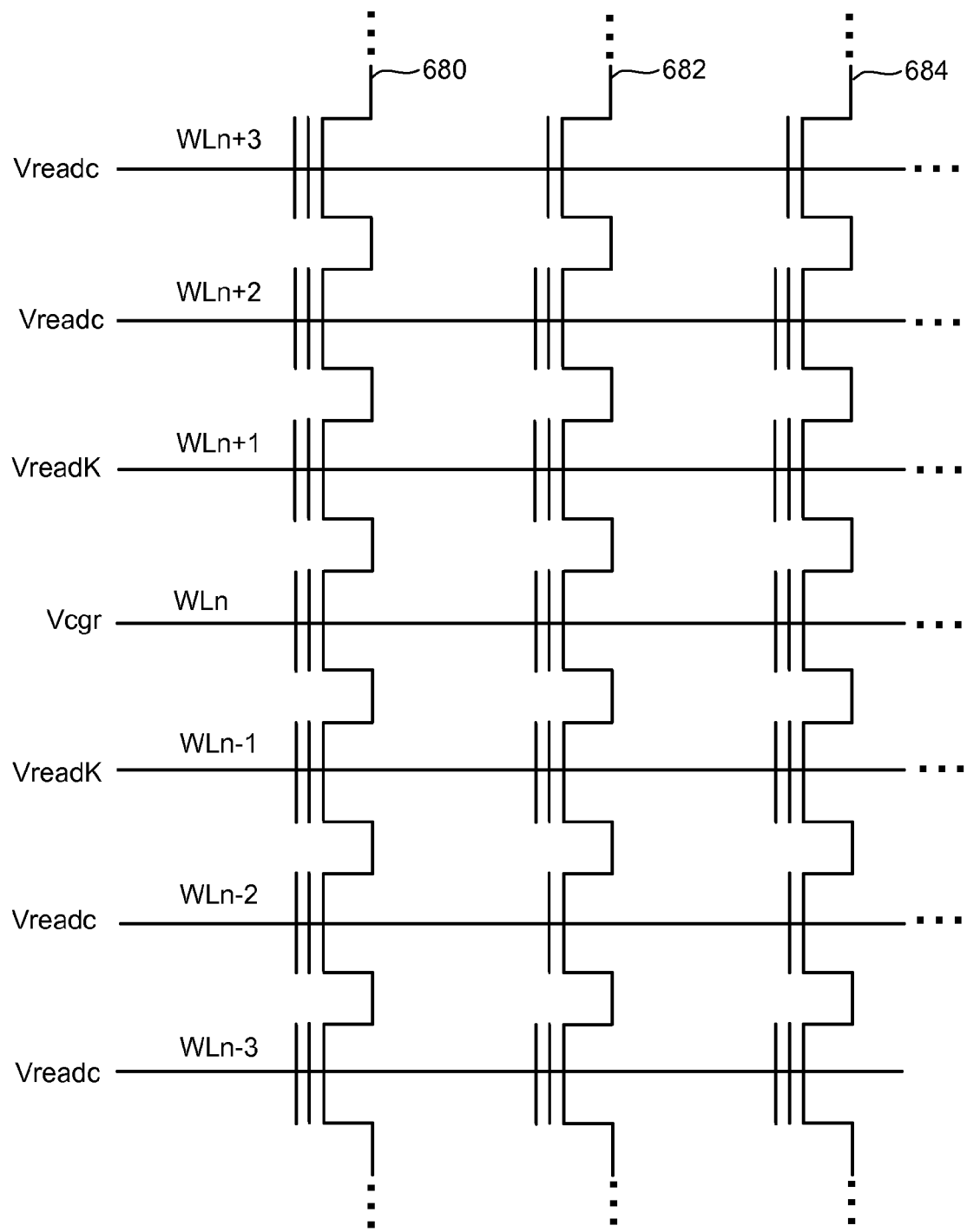
FIG. 15 depicts portions of three NAND strings.

Looking back at FIG. 12, steps 650-656 includes setting up the appropriate voltages and sensing a condition of the selected memory cells. FIG. 15 depicts portions of three NAND strings receiving the appropriate voltages applied by steps 650-654. In some embodiments, steps 650-654 are performed concurrently. As can be seen in FIG. 15, the selected word line (WLn) receives the read compare voltage Vcgr. The neighbor word lines WLn+1 and WLn−1 receive VreadK. All other unselected word lines will receive the current read pass voltage Vreadc (calculated in step 648 of FIG. 12).

In some embodiments, VreadK is slightly higher (e.g., 0-1 volt higher) than VreadC. In other embodiments, VreadK can be the same as VreadC. In yet other embodiments, VreadK can vary based on position of WLn in the NAND string, data being written, number of program/erase cycles performed, data in neighboring word lines, or other schemes. Examples of using a read pass voltage on neighboring word lines can be found in U.S. Pat. No. 7,898,864 and U.S. Pat. No. 7,499,319, both of which are incorporated by reference in their entirety.

Figure 16:
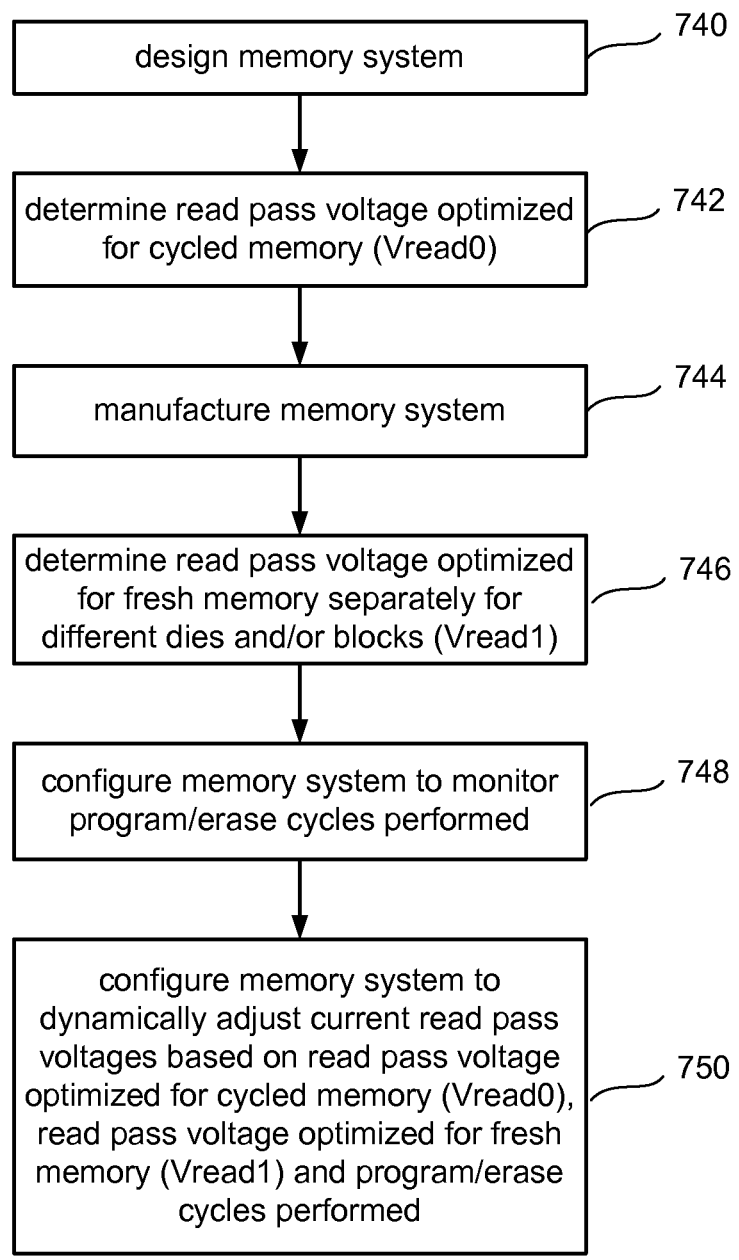
FIG. 16 is a flow chart describing one embodiment of a process for making and configuring a non-volatile memory system.

FIG. 16 is a flowchart describing one embodiment of a process for making and configuring a non-volatile memory system. The process depicted in FIG. 16 is one example implementation of step 548 of FIG. 7. In step 740 of FIG. 16, a memory system is designed using techniques known in the art. In step 742. the read pass voltage optimized for cycled memory (Vread0) is determined. Step 742 can be performed using simulation, experimentation or testing. More details of step 742 will be provided below. In step 744, the memory system is manufactured. It is anticipated that hundreds, thousands or millions of copies of a memory system can be manufactured. The technology described herein does not require any particular manufacturing process and known manufacturing processes can be used. In step 746, the read pass voltage optimized for fresh memory (Vread1) is separately determined for different dies (and/or different blocks) for a wafer. The process performed in step 746 can be performed using simulation, testing or experimentation. In one embodiment, the process of 746 is performed during the manufacturing process as part of a die sort process. More details about step 746 are provided below. In step 748, the memory system will be configured to monitor and count the number of program/erase cycles performed. For example, one or more memory locations or registers will be provisioned to store the count or other indication of the number of program/erase cycles performed. Code can be installed in the memory for the controller to keep track of the program/erase cycles. Alternatively, special hardware can be added to count the number of program/erase cycles performed. In step 750, the memory system is configured to dynamically and automatically calculate the current read pass voltage (Vreadc) based on the read pass voltage optimized for cycled memory (Vread0), the read pass voltage optimized for fresh memory (Vread1) and the number of programs/erase cycles performed. For example, the controller can be loaded with software to implement any of the functions described above with respect to FIG. 13 and to perform all or a portion of the process of FIG. 12.

Figure 17:
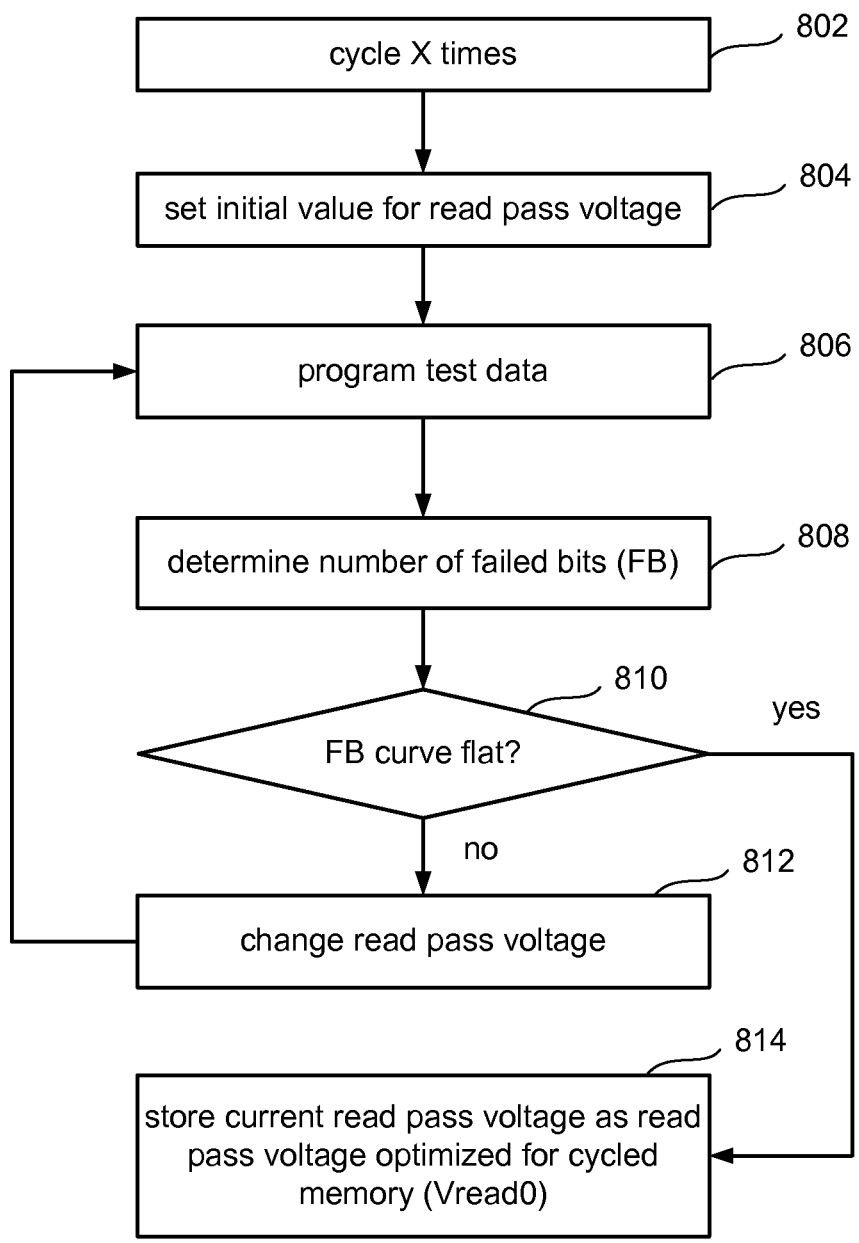
FIG. 17 is a flow chart describing one embodiment of a process for determining a read pass voltage optimized for cycled memory.

FIG. 17 is a flowchart describing one embodiment of a process for determining a read pass voltage optimized for cycled memory (Vread0). The process depicted in FIG. 17 is one example implementation of performing step 742 of FIG. 16. Additionally, the process of FIG. 17 can be performed on a sample part or can be performed using simulation or other type of experimentation. In step 802 of FIG. 17, the memory system is cycled X times. The number of cycles can vary based on the particular implementation. In one embodiment, step 802 will include cycling the memory system one hundred times so that the memory system is now in a cycled condition. In step 804, an initial value will be set for the read pass voltage. In one embodiment, the initial value is ten volts. In step 806, test data will be programmed into the memory. In step 808, the system will determine a number of failed bits (FB). The number of failed bits (FB) is the number of memory cells that have not been programmed to the appropriate data state at the conclusion of the programming process. For example, looking back at the process of FIG. 11, the memory system will stop programming if the number of failed bits is less than a predetermined limit (see step 582) or the number of iterations of programming has reached a limit (see step 584). In either case, at the end of that programming process, some memory cells will not have been programmed properly. Step 808 includes counting the number of memory cells that have not programmed properly. After a number of iterations of steps 806 and 808, the system will have a number of failed bit (FB) values which can be plotted in a graph, and for which a curve can be fitted to the data. In step 810, it is determined whether the curve has flattened out. If the curve has not flattened out, then the read pass voltage is changed in step 812. For example, the read pass voltage can be lowered by 0.2 volts (or some other value). After lowering the read pass voltage in step 812, the process loops back to step 806 and another iteration of steps 806-808 are performed. With each iteration of steps 806 and 808, a new failed bit value (FB) is determined. When the curve that fits all the FB data starts to flatten, it is assumed that changing the read pass voltage will no longer have a significant impact on a performance. Therefore, when the failed bit curve has flattened (see step 810), then the process will continue at step 814 and the current read pass voltage for the last iteration of steps 806-808 will be stored as the read pass voltage optimized for cycled memory (Vread0).

Although FIG. 17 provides one example implementation for determining a read pass voltage optimized for cycled memory, other processes can also be used. In one embodiment, FIG. 17 will be performed for a wafer such that all die on the wafer will have the same read pass voltage optimized for cycled memory (Vread0). In some embodiments, the read pass voltage optimized for cycled memory (Vread0) can be calculated for multiple wafers at a time for all wafers associated with a current design. For example, the read pass voltage optimized for cycled memory (Vread0) can be calculated for all wafers manufactured for a particular design.

Figure 18:
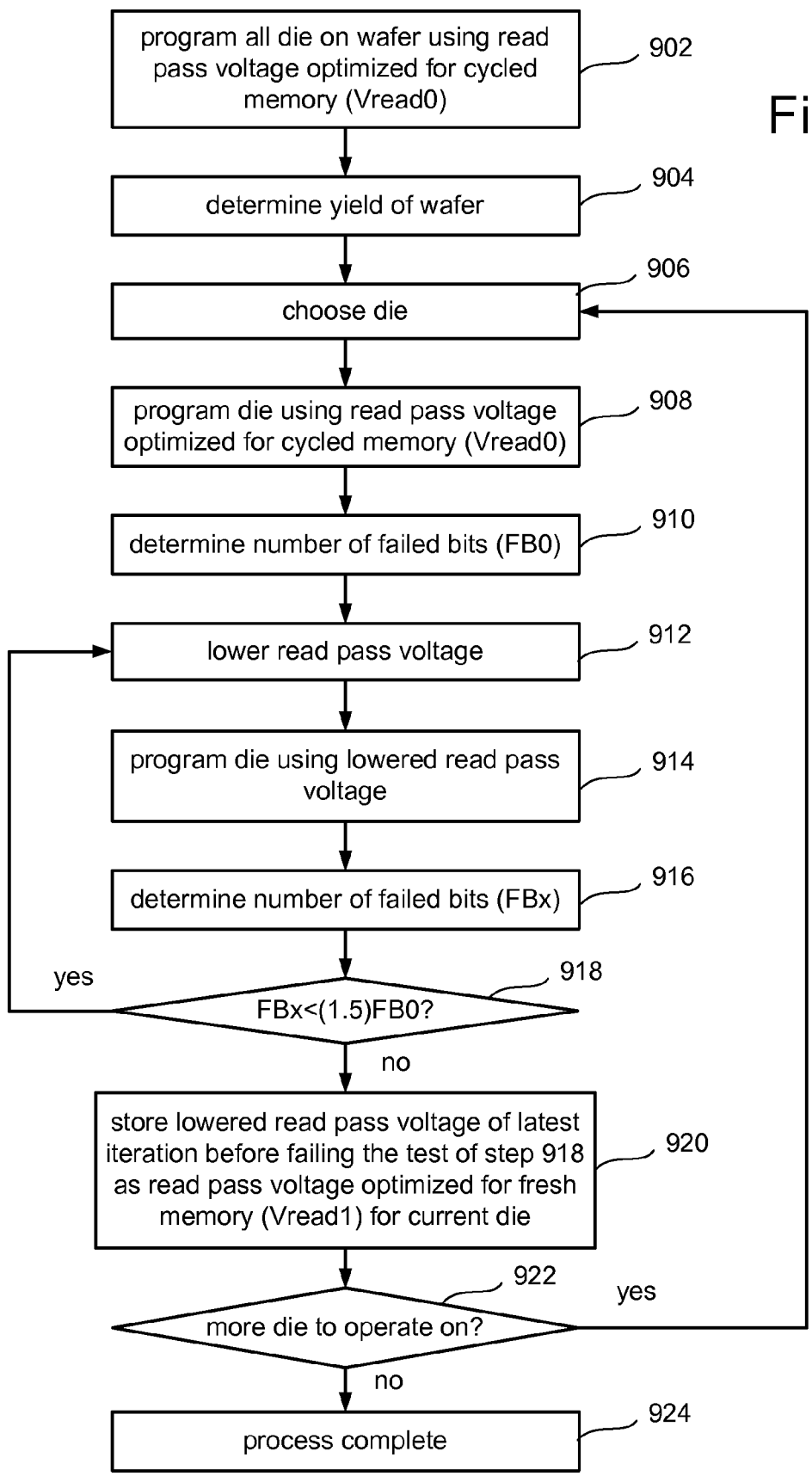
FIG. 18 is a flow chart describing one embodiment of a process for determining a read pass voltage optimized for fresh memory.

FIG. 18 is a flowchart describing what embodiment of a process for determining a read pass voltage optimized for fresh memory (Vread1). The process of FIG. 18 is one example implementation of step 746 of FIG. 16. In one example, the process of FIG. 18 is performed as part of the test phase during manufacturing, coinciding with (or as part of) the die sort process. In one example implementation, the system will calculate a read pass voltage optimized for fresh memory (Vread1) separately for each die on a wafer. Alternatively, the system can determine a read pass voltage optimized for fresh memory (Vread1) for each block of each die on a wafer.

In step 902 of FIG. 18, the system (e.g. a testing apparatus) will program all the die on a wafer using the read pass voltage optimized for cycled memory (Vread0). Step 902 can include programming a random test pattern or a predetermined test pattern. In step 904, the system will determine the yield of the wafer. That is, the system will determine how many failed bits there were for each die. If the number of failed bits are less than a predetermined number, then the die is considered acceptable. If the number of failed bits is above the predetermined number, then the die is rejected. Determining the yield of the wafer (part of die sort) can be performed by known processes in the art. In one set of embodiments, the determination of the yield of the wafer is based on using the read pass voltage optimized for cycled memory (Vread0) without using the read pass voltage optimized for fresh memory (Vread1).

As described above, one embodiment includes determining a separate read pass voltage optimized for fresh memory (Vread1) for each die. Therefore, in step 906 one die on the wafer is chosen. It is assumed that step 906 will only choose die that were accepted as being successfully manufactured in step 904. In step 908, that chosen die will be programmed using the read pass voltage optimized for cycled memory (Vread0). In step 910, the system will determine the number of failed bits based on the programming of step 908. In step 912, the read pass voltage currently being used to program the chosen die will be lowered by a predetermined step size (e.g. 0.2 volts or 0.4 volts or another number). In step 914, the die is again programmed, but this time using the lower read pass voltage (as lowered in step 912). In step 916, the system will determine the number of failed bits from the latest programming (last iteration of step 914). In step 918, it is determined whether the number of failed bits in the latest iteration of programming (FBx) is less than a predetermined percentage of the number of failed bits when using the read pass voltage optimized for cycled memory (Vread0). In one example, the predetermined percentage is 150% such that step 918 tests whether the number of failed bits in the latest iteration of programming (FBx) is less than 1.5 times the number of failed bits that occur when using the read pass voltage optimized for cycled memory. Although the one example of step 918 uses 1.5, other numbers (or percentages) can be used. As long as the number of failed bits for the current iteration of programming is less than the predetermined percentage (e.g. 150% or 1.5) of the failed bits associated with using the read pass voltage optimized for cycled memory, the loop of steps 912-918 will be repeated. Once the number of failed bits is more than 1.5 times the number of failed bits obtained from using the read pass voltage optimized for cycled memory, then the loop will stop and in step 920 the last read pass voltage for which the number of failed bits (FBx) was less than 1.5 times the number of failed bits for using the read pass voltage optimized for cycled memory is stored as the read pass voltage optimized for fresh memory (Vread1) for the current die. In step 922 it is determined whether there are more die to operate on. If there are more die that have not been tested, then the process loops to step 906 and chooses the next die. If there are no more die to operate on for the particular wafer, then the process is complete (step 924). In one embodiment, rather than operate on the die sequentially, the system can operate on multiple die in parallel. In some embodiments, the Vread0 and Vread1 are used for both reading and verification (during programming).

In one alternative, the process of FIG. 18 can be performed on a sample memory or one representative memory, rather than individual dies. In this manner, all dies for a wafer will have the same Vread1 and the function for calculating Vreadc can be built into the controller. In other embodiments, the process of FIG. 18 can be performed using simulation.

One embodiment includes accessing an indication of program/erase cycles, dynamically determining a current read pass voltage for multiple word lines on a common side of a selected word line based on the indication of program/erase erase cycles, and reading data from one or more non-volatile storage elements connected to the selected word line. The reading data includes applying the determined current read pass voltage to multiple word lines on the common side of the selected word line and applying a read voltage to the selected word line.

One embodiment includes a plurality of non-volatile storage elements, a plurality of word lines and bit lines in communication with the non-volatile storage elements, and one or more managing circuits in communication with the non-volatile storage elements to program, erase and read the non-volatile storage elements. The one or more managing circuits read from the non-volatile storage elements by accessing an indication of program/erase cycles, dynamically determining a current read pass voltage based on the indication of program/erase erase cycles for multiple word lines on a common side of a selected word line and reading data from one or more non-volatile storage elements connected to the selected word line by applying the determined current read pass voltage to multiple word lines on the common side of the selected word line and applying a read voltage to the selected word line.

One embodiment includes accessing a first read pass voltage, reading a starting read pass voltage calculated specific to a first die to result in a number of failed bits for the first die in a fresh condition to be within a predetermined percentage of a number of failed bits caused by the first read pass voltage for the first die in the fresh condition, accessing an indication of program/erase cycles for the first die, dynamically determining a first current read pass voltage based on the first read pass voltage, the starting read pass voltage and the indication of program/erase erase cycles for the first die, and reading data from the first die using the first current read pass voltage.

One embodiment includes a plurality of non-volatile storage elements arranged on a first die and a second die and one or more managing circuits in communication with the first die and the second die to program, erase and read the non-volatile storage elements on the first die and the second die. The one or more managing circuits read from the non-volatile storage elements on the first die by accessing a first read pass voltage, reading a starting read pass voltage calculated specific to the first die to result in a number of failed bits for the first die in a fresh condition to be within a predetermined percentage of a number of failed bits caused by the first read pass voltage used for the first die in the fresh condition, accessing an indication of program/erase cycles for the first die, dynamically determining a first current read pass voltage based on the first read pass voltage, the starting read pass voltage and the indication of program/erase erase cycles for the first die, and reading data from the first die using the first current read pass voltage.

One embodiment includes determining a first read pass voltage for cycled memory, separately determining one or more starting read pass voltages for one or more dies and storing respective starting read pass voltages on respective dies, configuring non-volatile storage devices that each include one or more dies to monitor program/erase cycles for the dies and configuring the non-volatile storage devices that each include one or more dies to read data from the dies and dynamically adjust current read pass voltages used to read data based on the first read pass voltage for cycled memory, respective starting read pass voltages and program/erase cycle counts.

One embodiment includes determining a first read pass voltage for cycled memory using simulation, determining a starting read pass voltages for a die by identifying a pass voltage that results in a number of failed bits for the die in a fresh condition that is within a predetermined percentage of a number of failed bits caused by using the first read pass voltage for the die in the fresh condition, and configuring a non-volatile storage device to monitor program/erase cycles and read data from the die. The reading data from the die includes dynamically determining a current read pass voltage based on the first read pass voltage for cycled memory, the starting read pass voltage and program/erase cycle counts.

In one example implementation the determining the starting read pass voltages for the die comprises (a) programming the die using the first read pass voltage as the current pass voltage to verify programming, (b) counting failed bits, (c) programming the die using a lower current pass voltage than the previous iteration to verify programming, (d) counting failed bits, (e) determining whether the failed bits counted in (d) is within a predetermined percentage of the failed bits counted in (b); (f) repeating (c)-(f) if the failed bits counted in (d) is within the predetermined percentage of the failed bits counted in (b); and (g) setting the starting read pass voltage to be the current pass voltage from the most recent iteration if the failed bits counted in (d) is within the predetermined percentage of the failed bits counted in (b).

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:
1. A method for operating non-volatile storage, comprising:
    accessing an indication of program/erase cycles;
    dynamically determining a current read pass voltage for multiple word lines on a common side of a selected word line based on the indication of program/erase erase cycles; and
    reading data from one or more non-volatile storage elements connected to the selected word line, the reading data includes applying the determined current read pass voltage to multiple word lines on the common side of the selected word line and applying a read voltage to the selected word line.

2. The method of claim 1, wherein:
the reading data includes applying the determined current read pass voltage to multiple word lines on both sides of the selected word line.

3. The method of claim 1, wherein:
the reading data includes applying the determined current read pass voltage to multiple word lines on both sides of the selected word line and applying a different pass voltage to a neighbor word line, the neighbor word line is adjacent to the selected word line.

4. The method of claim 1, wherein:
the reading data includes applying the determined current read pass voltage to multiple word lines on both sides of the selected word line and applying a different pass voltage to both neighbor word lines, the neighbor word lines are adjacent to the selected word line.

5. The method of claim 1, wherein:
the reading data includes applying the determined current read pass voltage to all unselected word lines on both sides of the selected word line except for word lines adjacent to the selected word line.

6. The method of claim 1, wherein the dynamically determining the current read pass voltage comprises:
accessing a first read pass voltage;
reading a starting read pass voltage calculated specific to a first die to result in a number of failed bits for the first die in a fresh condition to be within a predetermined percentage of a number of failed bits caused by the first read pass voltage for the first die in the fresh condition; and
determining the current read pass voltage based on the first read pass voltage, the starting read pass voltage and the indication of program/erase erase cycles.

7. The method of claim 6, wherein the determining the current read pass voltage comprises:
interpolating the current read pass voltage between the first read pass voltage and the starting read pass voltage based on the indication of program/erase erase cycles.

8. The method of claim 1, wherein the dynamically determining the current read pass voltage comprises:
accessing a first read pass voltage optimized for a cycled die;
accessing a second read pass voltage optimized for a fresh die; and
interpolating the current read pass voltage between the first read pass voltage and the second read pass voltage based on the indication of program/erase erase cycles.

9. The method of claim 1, wherein the indication of program/erase cycles indicates a number of program/erase cycles for a first die and the one or more non-volatile storage elements connected to the selected word line are on the first die, the method further comprising:
accessing an indication of program/erase cycles for a second die;
dynamically determining a read pass voltage for the second die based on the indication of program/erase cycles for a second die; and
reading data from the second die while applying the determined read pass voltage for the second die to multiple word lines on the second die.

10. The method of claim 1, wherein the indication of program/erase cycles indicates a number of program/erase cycles for a first block and the one or more non-volatile storage elements connected to the selected word line are in the first block, the method further comprising:
accessing an indication of program/erase cycles for a second block;
dynamically determining a read pass voltage for the second block based on the indication of program/erase cycles for the second block; and
reading data from the second block while applying the determined read pass voltage for the second block to multiple word lines on the second block.

11. A non-volatile storage apparatus, comprising:
a plurality of non-volatile storage elements;
a plurality of word lines and bit lines in communication with the non-volatile storage elements; and
one or more managing circuits in communication the non-volatile storage elements to program, erase and read the non-volatile storage elements;
the one or more managing circuits read from the non-volatile storage elements by accessing an indication of program/erase cycles, dynamically determining a current read pass voltage based on the indication of program/erase erase cycles for multiple word lines on a common side of a selected word line and reading data from one or more non-volatile storage elements connected to the selected word line by applying the determined current read pass voltage to multiple word lines on the common side of the selected word line and applying a read voltage to the selected word line.

12. The apparatus of claim 11, wherein:
the one or more managing circuits read data by applying the determined current read pass voltage to multiple word lines on both sides of the selected word line.

13. The apparatus of claim 11, wherein:
the one or more managing circuits read data by applying the determined current read pass voltage to multiple word lines on both sides of the selected word line and applying a different pass voltage to a neighbor word line, the neighbor word line is adjacent to the selected word line.

14. The apparatus of claim 11, wherein:
the one or more managing circuits read data by applying the determined current read pass voltage to multiple word lines on both sides of the selected word line and applying a different pass voltage to both neighbor word lines, the neighbor word lines are adjacent to the selected word line.

15. The apparatus of claim 11, wherein:
the one or more managing circuits dynamically determining the current read pass voltage by accessing a first read pass voltage, reading a starting read pass voltage calculated specific to a first die to result in a number of failed bits for the first die in a fresh condition to be within a predetermined percentage of a number of failed bits caused by the first read pass voltage for the first die in the fresh condition, and determining the current read pass voltage based on the first read pass voltage, the starting read pass voltage and the indication of program/erase erase cycles.

16. The apparatus of claim 11, wherein:
the non-volatile storage elements are arranged on multiple dies;
each die has an individually calculated start read pass voltage;
multiple dies use a common second read pass voltage;
the one or more managing circuits determine the current read pass voltage for a respective die based on the respective indication of program/erase erase cycles, the respective individually calculated start read pass voltage and the common second read pass voltage.

17. The apparatus of claim 11, wherein:
the non-volatile storage elements are arranged in multiple blocks on one or multiple dies;
each of the multiple blocks has an individually calculated start read pass voltage;
multiple blocks share a second read pass voltage;
the one or more managing circuits determine the current read pass voltage based on the indication of program/erase erase cycles, the start read pass voltage from a block being read from and the second read pass voltage.

18. The apparatus of claim 11, wherein:
the non-volatile storage elements are multi-state NAND flash memory devices.

19. A method for operating non-volatile storage, comprising:
accessing a first read pass voltage;
reading a starting read pass voltage calculated specific to a first die to result in a number of failed bits for the first die in a fresh condition to be within a predetermined percentage of a number of failed bits caused by the first read pass voltage for the first die in the fresh condition;
accessing an indication of program/erase cycles for the first die;
dynamically determining a first current read pass voltage based on the first read pass voltage, the starting read pass voltage and the indication of program/erase erase cycles for the first die; and
reading data from the first die using the first current read pass voltage.

20. The method of claim 19, wherein the determining the current read pass voltage comprises:
interpolating the first current read pass voltage between the first read pass voltage and the starting read pass voltage based on the indication of program/erase erase cycles for the first die.

21. The method of claim 19, further comprising:
reading a starting read pass voltage calculated specific to a second die to result in a number of failed bits for the second die in a fresh condition to be within a predetermined percentage of a number of failed bits caused by the first read pass voltage for the second die in the fresh condition;
accessing an indication of program/erase cycles for the second die;
dynamically determining a second current read pass voltage based on the first read pass voltage, the starting read pass voltage and the indication of program/erase erase cycles for the second die, the first die and the second die are in a common non-volatile storage system; and
reading data from the second die using the second current read pass voltage.

22. A non-volatile storage apparatus, comprising:
a plurality of non-volatile storage elements arranged on a first die and a second die; and
one or more managing circuits in communication with the first die and the second die to program, erase and read the non-volatile storage elements on the first die and the second die;
the one or more managing circuits read from the non-volatile storage elements on the first die by accessing a first read pass voltage, reading a starting read pass voltage calculated specific to the first die to result in a number of failed bits for the first die in a fresh condition to be within a predetermined percentage of a number of failed bits caused by the first read pass voltage used for the first die in the fresh condition, accessing an indication of program/erase cycles for the first die, dynamically determining a first current read pass voltage based on the first read pass voltage, the starting read pass voltage and the indication of program/erase erase cycles for the first die, and reading data from the first die using the first current read pass voltage.

23. The non-volatile storage apparatus of claim 22, wherein:
the one or more managing circuits read from the non-volatile storage elements on the second die by accessing the first read pass voltage, reading a starting read pass voltage calculated specific to the second die to result in a number of failed bits for the second die in a fresh condition to be within a predetermined percentage of a number of failed bits caused by the first read pass voltage used for the second die in the fresh condition, accessing an indication of program/erase cycles for the second die, dynamically determining a second current read pass voltage based on the first read pass voltage, the starting read pass voltage for the second die and the indication of program/erase erase cycles for the second die, and reading data from the second die using the second current read pass voltage.

24. A method for use with non-volatile storage, comprising:
determining a first read pass voltage for cycled memory;
separately determining one or more starting read pass voltages for one or more dies and storing respective starting read pass voltages on respective dies;
configuring non-volatile storage devices that each include one or more dies to monitor program/erase cycles for the dies; and
configuring the non-volatile storage devices that each include one or more dies to read data from the dies and dynamically adjust current read pass voltages used to read data based on the first read pass voltage for cycled memory, respective starting read pass voltages and program/erase cycle counts.

25. The method of claim 24, wherein the separately determining one or more starting read pass voltages comprises:
(a) programming a first die using the first read pass voltage as the current pass voltage to verify programming,
(b) counting failed bits;
(c) programming the first die using a lower current pass voltage than the previous iteration to verify programming;
(d) counting failed bits;
(e) determining whether the failed bits counted in (d) is within a predetermined percentage of the failed bits counted in (b);
(f) repeating (c)-(f) if the failed bits counted in (d) is within the predetermined percentage of the failed bits counted in (b); and
(g) setting the starting read pass voltage for the first die to be the current pass voltage from the most recent iteration if the failed bits counted in (d) is within the predetermined percentage of the failed bits counted in (b).

26. The method of claim 24, wherein:
the separately determining one or more starting read pass voltages is performed on the one or more dies.

27. The method of claim 24, wherein:
the determining the first read pass voltage is performed using simulation.

28. The method of claim 24, wherein:
the determining the first read pass voltage is performed using a sample part.

29. The method of claim 24, wherein:
the separately determining one or more starting read pass voltages is performed during a die sort process.

30. The method of claim 24, further comprising:
performing a test of yield for a wafer using the first read pass voltage.

31. A method for use with non-volatile storage, comprising:
determining a first read pass voltage for cycled memory using simulation;
determining a starting read pass voltages for a die by identifying a pass voltage that results in a number of failed bits for the die in a fresh condition that is within a predetermined percentage of a number of failed bits caused by using the first read pass voltage for the die in the fresh condition; and
configuring a non-volatile storage device to monitor program/erase cycles and read data from the die, the reading data from the die includes dynamically determining a current read pass voltage based on the first read pass voltage for cycled memory, the starting read pass voltage and program/erase cycle counts.

32. The method of claim 31, wherein the determining the starting read pass voltages for the die comprises:
(a) programming the die using the first read pass voltage as the current pass voltage to verify programming,
(b) counting failed bits;
(c) programming the die using a lower current pass voltage than the previous iteration to verify programming;
(d) counting failed bits;
(e) determining whether the failed bits counted in (d) is within a predetermined percentage of the failed bits counted in (b);
(f) repeating (c)-(f) if the failed bits counted in (d) is within the predetermined percentage of the failed bits counted in (b); and
(g) setting the starting read pass voltage to be the current pass voltage from the most recent iteration if the failed bits counted in (d) is within the predetermined percentage of the failed bits counted in (b).

33. The method of claim 31, further comprising:
testing functionality of the die by programming and reading using the first read pass voltage.

* * * * *